United States Patent
Lee

(10) Patent No.: US 11,450,702 B2
(45) Date of Patent: Sep. 20, 2022

(54) IMAGE SENSOR DEVICE

(71) Applicant: SK hynix Inc., Gyeonggi-do (KR)

(72) Inventor: Young Guk Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 253 days.

(21) Appl. No.: 17/008,011

(22) Filed: Aug. 31, 2020

(65) Prior Publication Data

US 2021/0351209 A1   Nov. 11, 2021

(30) Foreign Application Priority Data

May 11, 2020 (KR) .................. 10-2020-0055779

(51) Int. Cl.
*H01L 27/00* (2006.01)
*H01L 27/146* (2006.01)

(52) U.S. Cl.
CPC .... *H01L 27/1463* (2013.01); *H01L 27/14612* (2013.01); *H01L 27/14643* (2013.01); *H01L 27/14629* (2013.01); *H01L 27/14636* (2013.01)

(58) Field of Classification Search
CPC .......... H01L 27/14612; H01L 27/1463; H01L 27/14636; H01L 27/1464; H01L 27/14643
See application file for complete search history.

(56) References Cited

U.S. PATENT DOCUMENTS 9,030,584 B2   5/2015 Dai
9,985,062 B2   5/2018 Jung
10,014,417 B2  7/2018 Mizuta et al.

*Primary Examiner* — Reema Patel
(74) *Attorney, Agent, or Firm* — IP & T Group LLP

(57) ABSTRACT

An image sensor device which can reduce a chip size and power consumption, is disclosed. The image sensor device includes a substrate provided with a first surface and a second surface that are arranged to face each other, a pad disposed at the first surface of the substrate, a line layer disposed below the second surface of the substrate, a first through silicon via (TSV) formed to penetrate the substrate and the line layer, and disposed at one side of the pad, a second TSV formed to penetrate the substrate and the line layer, and disposed at the other side of the pad, and a power-supply switch disposed between the first TSV and the second TSV.

20 Claims, 3 Drawing Sheets

IMAGE SENSOR DEVICE

CROSS-REFERENCE TO RELATED APPLICATION

This patent document claims the priority and benefits of Korean patent application No. 10-2020-0055779, filed on May 11, 2020, which is hereby incorporated in its entirety by reference.

TECHNICAL FIELD

The technology and implementations disclosed in this patent document generally relate to an image sensor device, and more particularly to technology for reducing a chip size and power consumption.

BACKGROUND

An image sensor converts an optical image into electrical signals. Recently, with the increasing development of computer industries and communication industries, demand for high-quality and high-performance image sensors is rapidly increasing in various fields, for example, digital cameras, camcorders, personal communication systems (PCSs), game consoles, surveillance cameras, medical micro-cameras, etc.

Specifically, metal oxide semiconductor (MOS) image sensors can be driven more easily, and can be implemented using various scanning schemes. The MOS image sensor may include one or more photoelectric conversion elements configured to sense the magnitude of incident light and a multilayer metal line layer configured to output light signals stored in the photoelectric conversion elements. However, the incident light may be reflected by the metal line layer, and may be absorbed by an interlayer insulation film, resulting in reduction in sensitivity. In addition, the reflected light may be absorbed into contiguous (or adjacent) pixels, resulting in occurrence of crosstalk.

Therefore, an improved structure has been proposed, which polishes a backside of a substrate and receives light incident from the backside of the substrate. The improved structure may be referred to as a backside illuminated (BSI) image sensor. Since the metal line layer is not formed over a backside upon which light is incident in the BSI image sensor, the incident light is not reflected by the metal line layer or light absorption does not occur by an interlayer insulation film.

SUMMARY

Various embodiments of the disclosed technology relate to an image sensor device capable of reducing a chip size and power consumption by simplifying a power-supply routing path.

In accordance with an embodiment of the disclosed technology, an image sensor device may include a substrate including a first surface and a second surface that are arranged to face each other, a pad disposed at the first surface of the substrate, a line layer disposed below the second surface of the substrate, a first through silicon via (TSV) formed to penetrate the substrate and the line layer, and disposed at one side of the pad, a second TSV formed to penetrate the substrate and the line layer, and disposed at the other side of the pad, and a power-supply switch disposed between the first TSV and the second TSV.

In accordance with another embodiment of the disclosed technology, an image sensor device may include a substrate in which a pad region and a circuit region contiguous to the pad region are defined, a pad disposed at a first surface of the substrate in the pad region, a line layer disposed below the second surface of the substrate in the pad region and the circuit region, a first through silicon via (TSV) formed to penetrate the substrate and the line layer in the pad region, and disposed at one side of the pad, a second TSV formed to penetrate the substrate and the line layer in the circuit region, and disposed at the other side of the pad, and a power-supply switch disposed between the first TSV and the second TSV.

In accordance with still another embodiment of the disclosed technology, an image sensor device may include a first chip formed to receive a power-supply voltage through a reception pad, and configured to provide internal power to a logic circuit region, and a second chip stacked over the first chip. The second chip may include a substrate including a first surface and a second surface that are arranged to face each other, a pad disposed at the first surface of the substrate, a line layer disposed below the second surface of the substrate, a first through silicon via (TSV) formed to penetrate the substrate and the line layer, and disposed at one side of the pad, a second TSV formed to penetrate the substrate and the line layer, and disposed at the other side of the pad, and a power-supply switch disposed between the first TSV and the second TSV.

It is to be understood that both the foregoing general description and the following detailed description of the disclosed technology are illustrative and explanatory and are intended to provide further description of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
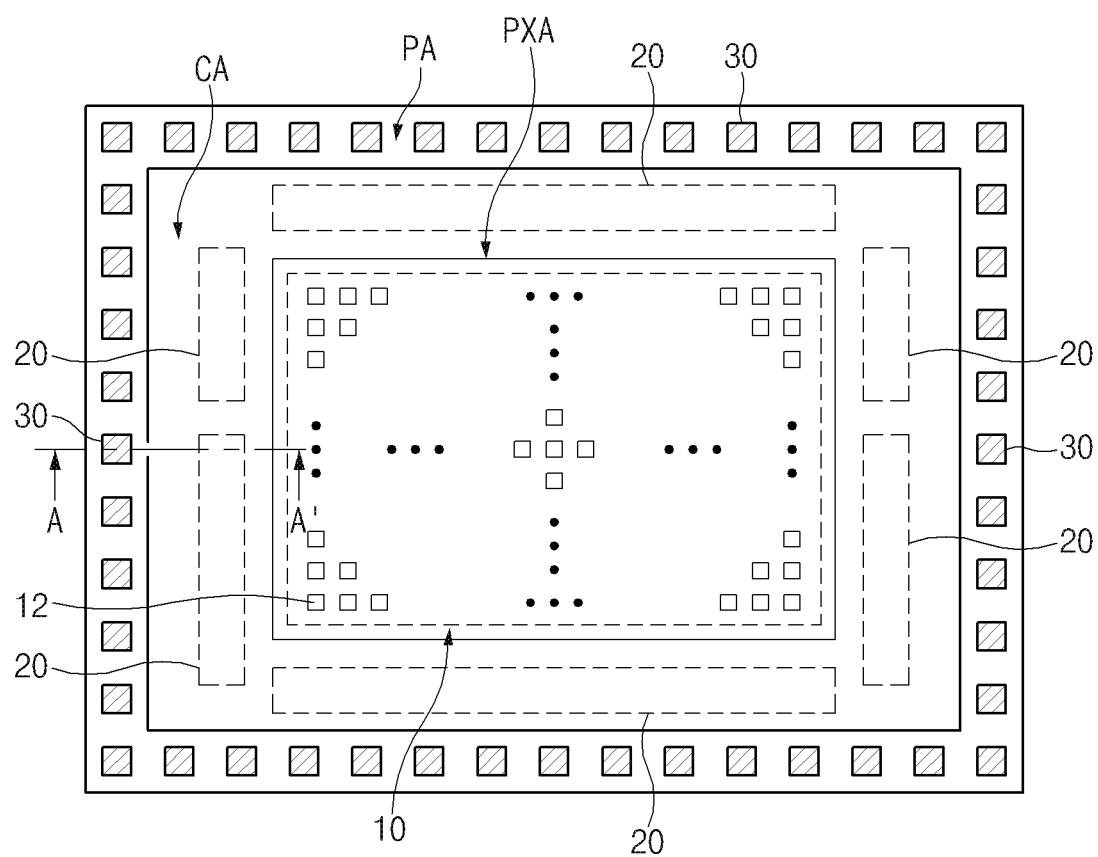
FIG. 1 is a schematic plan view illustrating an image sensor device according to an embodiment of the present disclosure.

This patent document provides various embodiments of an image sensor device that substantially addresses one or more issues due to limitations and disadvantages of the related art. Various embodiments of the disclosed technology are directed to an image sensor device which can reduce a chip size and power consumption.

Reference will now be made in detail to embodiments of the disclosed technology, examples of which are illustrated in the accompanying drawings. Wherever possible, the same reference numbers are used throughout the drawings to refer to the same or like portions.

Advantages and features of the disclosed technology and a method of achieving the advantages and features of the disclosed technology will be clearly understood from embodiments described hereinafter in conjunction with the accompanying drawings. However, the disclosed technology is not limited to the following embodiments and may be realized in various different forms. These embodiments are provided to disclose the technology so that a person having ordinary skill in the art to which the technology pertains may completely understand the disclosure. That is, the disclosed technology is defined by the claims. In the drawings, the sizes or relative sizes of layers and regions may be exaggerated for clarity of description.

The terminology used herein is for the purpose of describing particular embodiments only and is not intended to be limiting of the disclosed technology. As used herein, the singular forms are intended to include the plural forms as well, unless the context clearly indicates otherwise. It will be further understood that the terms "comprises" and/or "comprising," when used in this specification, specify the presence of stated constituent elements, steps, operations, and/or components, but do not preclude the presence or addition of one or more other constituent elements, steps, operations, and/or components thereof. The term "and/or" may include a combination of a plurality of items or any one of a plurality of items. The same reference numbers will be used throughout this specification to refer to the same or like constituent elements.

In description of the disclosed technology, the terms "first", "second" and the like may be used to describe various elements, components, and/or sections, but the elements, components, and/or sections are not limited by these terms. These terms may be used to distinguish one component, one constituent element, or one section from another component, another constituent element, or another section. Therefore, a first element, a first constituent element, or a first section may also be called a second element, a second constituent element, or a second section without departing from the scope of the disclosed technology.

When an element or a layer is referred to as being "on" another element or another layer, it can be directly on the element or the layer, or one or more intervening elements or layers may also be present. In contrast, when an element or a layer is referred to as being "directly on" another element or another layer, it means that no intervening elements or layers are present. The term "and/or" may include a combination of a plurality of items or any one of a plurality of items.

Spatially relative terms such as "below," "beneath," "lower," "above," or "upper" may be used herein to describe one element's relationship to another element as illustrated in the drawings. It will be understood that spatially relative terms are intended to encompass different orientations of the elements during the use or operation of the elements in addition to the orientation depicted in the drawings. Wherever possible, the same reference numbers will be used throughout the specification to refer to the same or like elements.

Furthermore, the embodiments described herein may be understood with reference to cross-sectional views and plan views of the disclosed technology. Accordingly, forms of the diagrams may be changed by fabrication technology and/or tolerance. Accordingly, the embodiments of the disclosed technology are not limited to the illustrated specific forms, but may include changes in forms generated according to a fabrication process. Accordingly, regions illustrated in the drawings have schematic attributes, and the shapes of the illustrated regions are intended to illustrate a specific form of a region of the element (or device) but are not intended to limit the scope of the disclosed technology.

Figure 2:
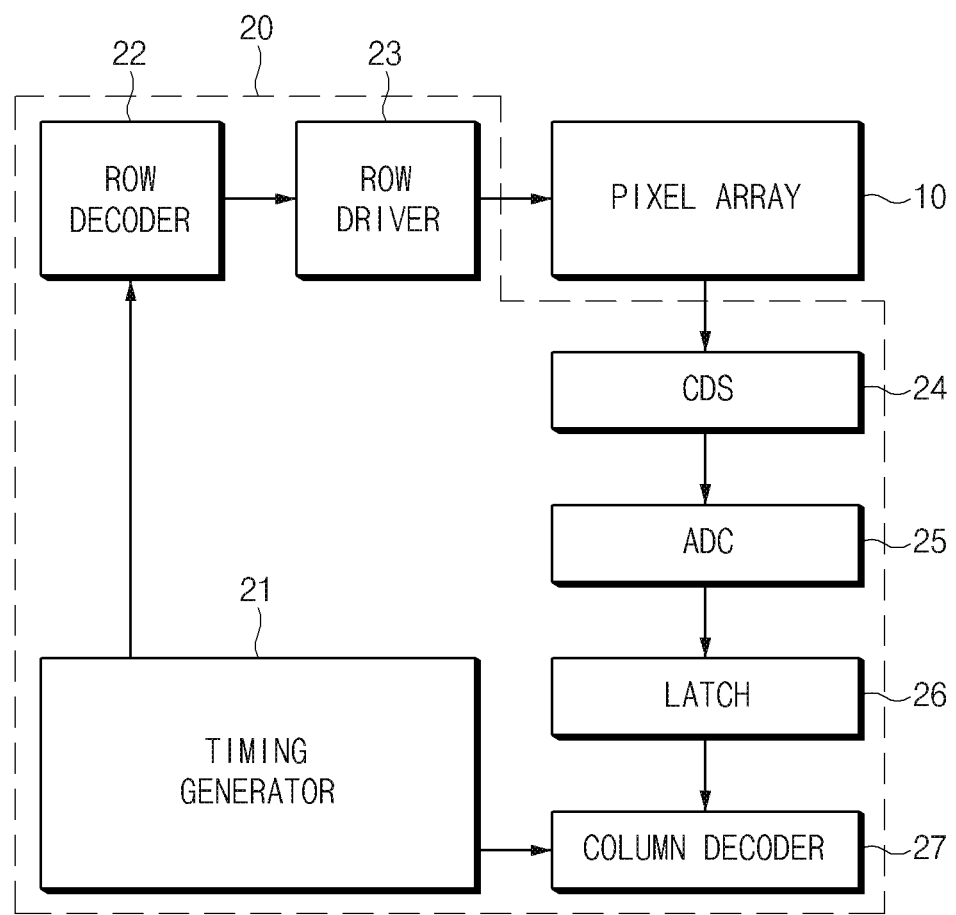
FIG. 2 is a block diagram illustrating some constituent elements of an image sensor device according to an embodiment of the present disclosure.

FIG. 1 is a schematic plan view illustrating an image sensor device 100 according to an embodiment of the present disclosure. FIG. 2 is a block diagram illustrating some constituent elements of the image sensor device 100 according to an embodiment of the present disclosure.

Referring to FIGS. 1 and 2, the image sensor device 100 may include a pixel region PXA, a circuit region CA, and a pad region PA.

The pixel region PXA may include a pixel array 10 in which a plurality of unit pixels 12 is arranged in a matrix shape. Each of the plurality of unit pixels 12 may include a photoelectric conversion element (not shown).

The circuit region CA may be formed around the pixel region PXA, and may include a plurality of circuits 20. The circuit region CA may include a plurality of CMOS transistors (not shown). The circuit region CA may transmit a predetermined signal to each unit pixel 12 of the pixel array 10, or may control an output signal at each unit pixel 12. The pad region PA may include a plurality of pads 30 located contiguous to the circuit region CA.

Referring to FIG. 1, the circuit region CA may be defined to surround the pixel region PXA, and the pad region PA may be defined to surround the circuit region CA, without being limited thereto. For example, the circuit region CA may not surround the pixel region PXA, and the pad region PA may be formed only at one side of the circuit region CA.

Referring to FIG. 2, the plurality of circuits 20 formed in the circuit region CA may include a timing generator 21, a row decoder 22, a row driver 23, a correlated double sampler (CDS) circuit 24, an analog-to-digital converter (ADC) circuit 25, a latch circuit 26, and a column decoder 27.

The pixel array 10 in the pixel region PXA may receive a plurality of drive signals, for example, a row selection signal, a reset signal, a charge transfer signal, etc., from the row driver 23, and may be driven by the received drive signals. In addition, electrical signals acquired by photoelectric conversion in the pixel array 10 may be provided to the CDS circuit 24.

The timing generator 21 may transmit a timing signal and control signals to the row decoder 22 and the column decoder 27. Upon receiving the decoded result from the row decoder 22, the row driver 23 may transmit, to the pixel array 10, a plurality of drive signals needed to drive the plurality of unit pixels 12 in the pixel array 10 of the pixel region PXA. If the plurality of unit pixels 12 is arranged in a matrix, the row driver 23 may provide a drive signal for each row of the matrix.

The CDS circuit 24 may receive output signals from the pixel array 10 of the pixel region PXA, and may hold and sample the received output signals. That is, the CDS circuit 24 may perform double sampling of a signal level caused by each output signal and a specific noise level, and may thus output a level difference corresponding to a difference between the noise level and the signal level.

The ADC circuit 25 may convert an analog signal corresponding to the level difference into a digital signal, and may thus output the digital signal. The latch circuit 26 may latch digital signals, and the latched signals may be sequentially output to an image signal output circuit (not shown) in response to the decoded result acquired by the column decoder 27.

Referring back to FIG. 1, in some implementations, the image sensor device 100 may be a backside illuminated (BSI) image sensor. In addition, light may be incident upon the pixel region PXA from the same surface as an exposure surface on which the plurality of pads 30 is exposed outside from among a plurality of exposure surfaces of the image sensor device 100.

The plurality of pads 30 may be electrically coupled to a plurality of wells formed in the circuit region CA through connection lines. In some embodiments, the plurality of pads 30 may be formed of metal, metal nitride, or a combination thereof. In some embodiments, the plurality of pads 30 in the pad region PA may transmit and receive electrical signals to and from an external device. In other embodiments, the plurality of pads 30 may serve to transfer a driving power source, such as a power-supply voltage or a ground voltage received from the outside, to circuits in the circuit region CA through a connection line.

Figure 3:
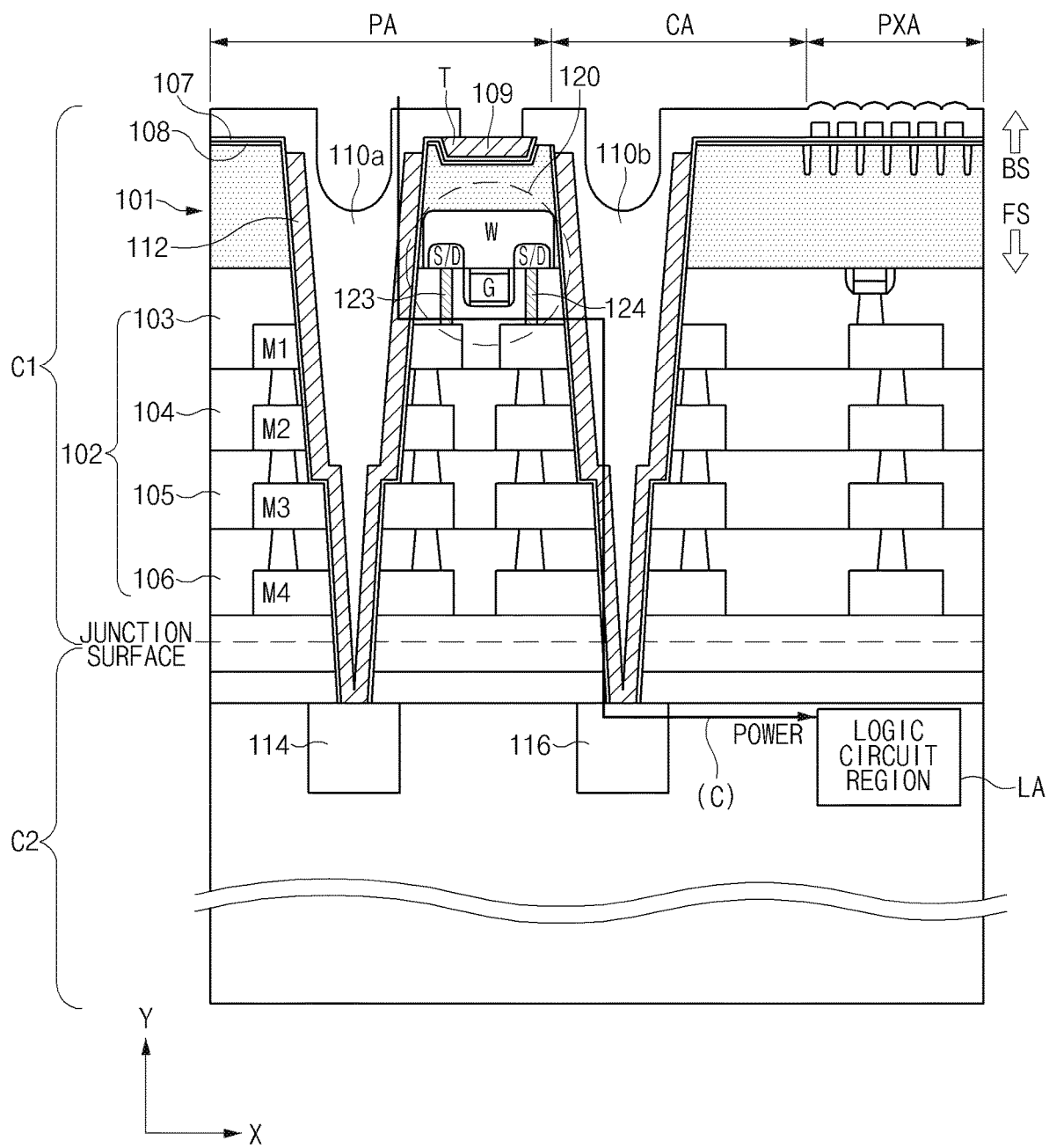
FIG. 3 is a cross-sectional view illustrating the image sensor device shown in FIG. 1.

FIG. 3 is a cross-sectional view illustrating an example of the image sensor device 100 shown in FIG. 1 based on various embodiments of the disclosed technology. In more detail, FIG. 3 is a cross-sectional view illustrating the pad region PA taken along the line A-A' in the image sensor device 100 shown in FIG. 1.

Referring to FIG. 3, a pad region PA, a circuit region CA, and a pixel region PXA may be defined in a substrate 101. The substrate 101 may include a front side (FS) and a back side (BS) that are arranged to face each other. One side of the substrate 101 may be defined as the front side (FS) and the other side of the substrate 101 may be defined as the back side (BS), without being limited thereto. For example, unit elements may be formed over the front side (FS) of the substrate 101, and light may be emitted to the back side (BS) of the substrate 101.

The substrate 101 may be implemented as any one of various types of substrates. For example, the substrate 101 may be a P-type or N-type bulk substrate, may be a substrate formed by growing a P-type or N-type epitaxial layer on the P-type bulk substrate, or may be a substrate formed by growing a P-type or N-type epitaxial layer on the N-type bulk substrate. In addition, the substrate 101 may also be formed of an organic plastic substrate rather than a semiconductor substrate.

A line layer 102 for signal transmission may be disposed over the front side (FS) of the substrate 101. The line layer 102 may include a plurality of lines M1~M4. The plurality of lines M1~M4 may be sequentially stacked over an interlayer insulation film (not shown). In this case, each of the plurality of lines M1~M4 may include metal. For example, the plurality of lines M1~M4 may include copper (Cu), platinum (Pt), tungsten (W), aluminum (Al), and an alloy layer formed of the above materials. The number of layers of the plurality of lines M1~M4 and structure types of the plurality of lines M1~M4 may not be limited thereto, and the plurality of lines M1~M4 may be formed in various numbers of layers and various types of structures according to device design methods.

A conductive layer 107 may be disposed over the back side (BS) of the substrate 101. The conductive layer 107 may be formed over the substrate 101. The conductive layer 107 may be formed to cover a top surface of the back side (BS) of the substrate 101. The conductive layer 107 may be formed over the pad region PA to be longer than the pad 109 in an X-axis direction. The conductive layer 107 may be formed to be thinner than the pad 109 in a Y-axis direction. The conductive layer 107 may be disposed in a trench T formed to expose some parts of the back side (BS) of the substrate 101. The conductive layer 107 may be formed along inner sidewalls of through silicon vias (TSVs) 110a and 110b. The conductive layer 107 may be formed to extend from the circuit region CA to the pixel region PXA in the X-axis direction.

The conductive layer 107 may be formed to prevent the substrate 101 from being damaged in a patterning process for forming the pad 109. In some embodiments, the conductive layer 107 may include metal, for example, tungsten (W).

An insulation layer 108 may be formed between a bottom surface of the conductive layer 107 and the back side (BS) of the substrate 101. The insulation layer 108 may be formed as an isolation pattern by which the conductive layer 107 and the substrate 101 can be electrically isolated from each other. The insulation layer 108 may be formed to prevent the conductive layer 107 from being electrically coupled to (i.e., from being short-circuited to) the substrate 101.

In this case, the insulation layer 108 may be formed of only one insulation material. In another example, the insulation layer 108 may be formed by stacking at least two insulation patterns. The insulation layer 108 may be formed of oxide materials such as silicon oxide and metal oxide, or may be formed of nitride materials such as silicon nitride.

The pad 109 may be disposed over the conductive layer 107 of the substrate 101. In this case, the pad 109 may be a constituent element corresponding to the pad 30 shown in FIG. 1. The pad 109 may be conformally formed along a top surface and sidewalls of the conductive layer 107 formed in the trench (T). In addition, the pad 109 and the plurality of lines M1~M4 may be electrically coupled to each other by the through silicon via (TSV) 110a formed to penetrate the substrate 101. In some embodiments, the pad 109 may include metal materials, for example, aluminum (Al), copper (Cu), etc.

The through silicon via (TSV) 110a and the through silicon via (TSV) 110b may be formed at both sides of the substrate 101 in the pad region PA and the circuit region CA, and may be formed to penetrate the substrate 101. That is, the through silicon via (TSV) 110a may be formed in the pad region PA, and the through silicon via (TSV) 110b may be formed in the circuit region CA. The through silicon via 110a and the through silicon via (TSV) 110b may be spaced apart from each other by a predetermined distance when viewed in a cross-section. Bottom surfaces of the through silicon vias (TSVs) 110a and 110b may be in contact with the plurality of lines M1~M4 and lower reception pads 114 and 116. That is, the through silicon vias (TSVs) 110a and 110b may be electrically coupled to the reception pads 114 and 116 formed in a lower chip C2 (i.e., a first chip), respectively. Each of the through silicon vias (TSVs) 110a and 110b may have a sidewall slope in a manner that an inner width of each through silicon via (TSV) 110a or 110b becomes smaller in a downward direction from the back side (BS) of the substrate 101. Alternatively, although not shown in the drawings, each of the through silicon vias (TSVs) 110a and 110b may also have a vertical sidewall slope as necessary.

A contact hole (not shown) penetrating the substrate 101 and the line layer 102 may be formed, and the contact hole (not shown) may be filled with a conductive material, resulting in formation of the through silicon vias (TSVs) 110a and 110b. The through silicon vias (TSVs) 110a and 110b may also be formed to fill the contact hole (not shown), and may also be conformally formed along sidewalls of the contact hole. The through silicon vias (TSVs) 110a and 110b may be formed in any shape by which the conductive layer 107 may be easily coupled to the plurality of lines M1~M4 and the reception pads 114 and 116. A metal film 112 may be formed at inner sidewalls of the through silicon vias (TSVs) 110a and 110b.

The image sensor device 100 based on some embodiments of the disclosed technology may include the through silicon via (TSV) 110a formed at both ends of the substrate 101 in the pad region PA and the through silicon via (TSV) 110b formed at both ends of the substrate 101 in the circuit region CA. That is, the through silicon vias (TSVs) 110a and 110b may be disposed in a region that does not overlap with the pad 109 in a direction (i.e., a Y-axis direction) perpendicular to the pad 109. In this case, the circuit region CA including the through silicon via (TSV) 110b may be a region in which a decoupling capacitor is formed.

The plurality of lines M1~M4 may be respectively formed in the interlayer insulation layers 103~106 in which the through silicon via (TSV) 110b is formed. The through silicon via (TSV) 110b may penetrate the lines M1~M4. Most parts of the front side (FS) of the upper chip C1 (i.e., a second chip) in the circuit region CA may be used as a decoupling capacitor region. Therefore, the image sensor device 100 based on some embodiments of the disclosed technology may form the through silicon via (TSV) 110b and the plurality of lines M1~M4 to transfer a power-supply voltage using the circuit region CA in which the decoupling capacitor is formed.

In addition, a power-supply switch 120 may be disposed over the front side (FS) of the substrate 101. That is, the power-supply switch 120 may be disposed in a region that overlaps with the pad 109 in the direction (i.e., Y-axis direction) perpendicular to the pad 109 in the pad region PA. The power-supply switch 120 may include a gate G, a source/drain (S/D) formed in a well (W), and contacts 123 and 124. For example, the power-supply switch 120 may be formed by forming the N-type source/drain (S/D) in the P-type well (W). In this case, the gate G may be formed in the interlayer insulation layer 103. The well W may be formed in the substrate 101 formed over the gate G. The contacts 123 and 124 may be formed between the line M1 and the power-supply switch 120.

For example, a control signal applied to the gate G of the power-supply switch 120 may be generated by the timing generator 21 shown in FIG. 2. In another example, the control signal applied to the gate G of the power-supply switch 120 may be received from a logic circuit region LA disposed in the lower chip C2 through a separate line (not shown). The logic circuit region LA may include a signal processing circuit to process signals. In some embodiments, the logic circuit region LA is disposed, but not limited to, below the pixel region PXA, and it should be noted that the logic circuit region LA can also be installed at other positions as needed.

The power-supply switch 120 may be turned on when the control signal is activated in an operation mode implemented by activation of the image sensor, such that a power-supply voltage received from the through silicon via (TSV) 110a may be transferred to the through silicon via (TSV) 110b. In contrast, when the control signal is deactivated in a standby mode, the power-supply switch 120 may be turned off so that a routing path of the power-supply voltage received from the through silicon via (TSV) 110a may be cut off.

In some embodiments, the power-supply switch 120 may include an NMOS transistor. By way of example but not limited to, the power-supply switch 120 includes the NMOS transistor. Alternatively, the power-supply switch 120 may include a PMOS transistor and may also be implemented as other types of switches as necessary.

In some embodiments, the image sensor device 100 may be implemented as a stacked structure of the plurality of image sensor chips. For example, the upper chip C1 may be stacked over the lower chip C2. The upper chip C1 and the lower chip C2 may be bonded to each other through junction surfaces thereof. That is, a bottom surface of the upper chip C1 may be bonded or coupled to a top surface of the lower chip C2.

In the case of using a general backside illuminated (BSI) image sensor device, when a power-supply voltage is applied to the general BSI image sensor device through the pad 109, the power-supply voltage may be transferred to the reception pad 114 of the lower chip C2 through the through silicon via (TSV) 110a. In addition, the power-supply voltage applied to the reception pad 114 may be transferred to the power-supply switch formed in the lower chip C2 through power-supply lines. When the power-supply switch formed in the lower chip C2 is turned on, internal power (POWER) may be transferred to the logic circuit region LA of the lower chip C2 through the reception pad 116.

However, when the power-supply switch is formed in the lower chip C2, the power-supply voltage received through the pad 109 may sequentially pass through the upper chip C1 and the power-supply switch of the lower chip C2, such that the resultant power-supply voltage may be provided as internal power (POWER). Therefore, during power transmission, many restrictions may occur in the power routing path. In addition, the routing path for power transmission may be elongated to increase resistance, such that IR drop (i.e., voltage drop) may occur, resulting in increase in power consumption.

If the power-supply switch is implemented as a relatively large-sized PMOS transistor, the power-supply switch may be formed to occupy most parts of the lower chip C2. Moreover, many more lines (or wires) to transfer the power-supply voltage through the power-supply switch are needed, such that the lines may be formed to occupy the larger-sized lower chip C2.

Therefore, the power-supply switch 120 may be disposed over the upper chip C1, such that the routing path for power transmission may be shortened. The routing path may be denoted by (C) shown in FIG. 3. That is, upon receiving the power-supply voltage through the pad 109, the power-supply voltage may be transferred to the power-supply switch 120 of the upper chip C1 through the through silicon via (TSV) 110a. When the power-supply switch 120 in the upper chip C1 is turned on, internal power (POWER) may be transferred to the logic circuit region LA through the through silicon via (TSV) 110b and the reception pad 116 of the lower chip C2.

As described above, the image sensor device in accordance with various embodiments may include the power-supply switch 120 disposed over the upper chip C1, and the through silicon via (TSV) 110b formed in the circuit region CA, such that the power-supply voltage of the power-supply switch 120 may be transferred to the lower chip C2. Therefore, the image sensor device may reduce the length of the routing path, and may omit lines (or wires) needed to transfer the power-supply voltage to the lower chip C2, such that the image sensor device may be formed to occupy a smaller region.

In an initial stage of designing the product, a channel width of the power-supply switch 120 may be established by referring to the amount of power consumed in the logic circuit region LA. However, a channel width appropriate for the power-supply switch 120 may be freely changed by developers or companies in a product development stage.

Specifically, as the design of the logic circuit region LA is in progress, power consumption increases and the power-supply switch 120 does not cover the increased power consumption, resulting in increase in IR drop. In accordance with various embodiments, the image sensor device may additionally allocate other elements to routing resources using the region of the lower chip C2, resulting in a guarantee of design flexibility.

As is apparent from the above description, the image sensor device based on various embodiments of the disclosed technology can reduce a chip size and power consumption.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

While the present disclosure has been described with respect to specific embodiments, it will be apparent to those skilled in the art that various changes and modifications may be made without departing from the spirit and scope of the disclosure as defined in the following claims.

What is claimed is:

1. An image sensor device comprising:
   a substrate including a first surface and a second surface that are arranged to face each other;
   a pad disposed at the first surface of the substrate;
   a line layer disposed below the second surface of the substrate;
   a first through silicon via (TSV) formed to penetrate the substrate and the line layer, and disposed at one side of the pad;
   a second TSV formed to penetrate the substrate and the line layer, and disposed at the other side of the pad; and
   a power-supply switch disposed between the first TSV and the second TSV.

2. The image sensor device according to claim 1, wherein the first TSV and the second TSV are disposed in a region that does not overlap with the pad in a direction perpendicular to the pad.

3. The image sensor device according to claim 1, wherein the power-supply switch is formed at the second surface of the substrate.

4. The image sensor device according to claim 1, wherein the power-supply switch is disposed in a region that overlaps with the pad in a direction perpendicular to the pad.

5. The image sensor device according to claim 1, wherein the power-supply switch includes:
   a gate formed in an interlayer insulation layer disposed below the second surface of the substrate; and
   a source and a drain formed in a well of the second surface.

6. The image sensor device according to claim 5, wherein the power-supply switch further includes:
   a contact through which the source, the drain, and the line layer are coupled to one another.

7. The image sensor device according to claim 1, wherein the power-supply switch includes an NMOS transistor.

8. The image sensor device according to claim 1, wherein:
   a power-supply voltage received through the pad is transferred to a lower substrate disposed below the line layer through the first TSV, the power-supply switch, and the second TSV.

9. The image sensor device according to claim 1, further comprising:
   a conductive layer disposed along the first surface of the substrate, the first TSV, and a side surface of the second TSV.

10. The image sensor device according to claim 9, wherein the conductive layer is formed in a trench exposing some parts of the substrate.

11. The image sensor device according to claim 10, wherein the pad is formed along a top surface and a side surface of the conductive layer formed in the trench.

12. The image sensor device according to claim 9, wherein the conductive layer is formed to be longer in length than the pad in a first direction.

13. The image sensor device according to claim 9, wherein the first TSV is electrically coupled to the pad through the conductive layer.

14. The image sensor device according to claim 1, wherein the pad is electrically coupled to a lower substrate disposed below the line layer by the first TSV.

15. An image sensor device comprising:
   a substrate in which a pad region and a circuit region contiguous to the pad region are defined;
   a pad disposed at a first surface of the substrate in the pad region;
   a line layer disposed below a second surface of the substrate facing the first surface, in the pad region and the circuit region;
   a first through silicon via (TSV) formed to penetrate the substrate and the line layer in the pad region, and disposed at one side of the pad;
   a second TSV formed to penetrate the substrate and the line layer in the circuit region, and disposed at the other side of the pad; and
   a power-supply switch disposed between the first TSV and the second TSV.

16. The image sensor device according to claim 15, wherein the power-supply switch includes:
   a gate formed in an interlayer insulation layer disposed below the second surface of the substrate; and
   a source and a drain formed in a well of the second surface.

17. The image sensor device according to claim 15, wherein:
   a power-supply voltage received through the pad is transferred to a lower substrate disposed below the line layer through the first TSV, the power-supply switch, and the second TSV.

18. An image sensor device comprising:
   a first chip formed to receive a power-supply voltage through a reception pad, and configured to provide internal power to a logic circuit region; and
   a second chip stacked over the first chip,
   wherein the second chip includes:
      a substrate including a first surface and a second surface that are arranged to face each other;
      a pad disposed at the first surface of the substrate;
      a line layer disposed below the second surface of the substrate;

a first through silicon via (TSV) formed to penetrate the substrate and the line layer, and disposed at one side of the pad;
a second TSV formed to penetrate the substrate and the line layer, and disposed at the other side of the pad; and
a power-supply switch disposed between the first TSV and the second TSV.

19. The image sensor device according to claim 18, wherein the power-supply switch includes:
a gate formed in an interlayer insulation layer disposed below the second surface of the substrate; and
a source and a drain formed in a well of the second surface.

20. The image sensor device according to claim 18, wherein:
a power-supply voltage received through the pad is transferred to the logic circuit region through the first TSV, the power-supply switch, and the second TSV.

* * * * *